(12) United States Patent
Lauvernier et al.

(10) Patent No.: US 10,246,001 B2
(45) Date of Patent: Apr. 2, 2019

(54) CARRIER OF ONE OR MORE LIGHT-EMITTING DIODES (LEDS) FOR A SIGNALING MODULE

(71) Applicant: Valeo Vision, Bobigny (FR)

(72) Inventors: Denis Lauvernier, Vitry sur Seine (FR); Zdravko Zojceski, Courbevoie (FR)

(73) Assignee: VALEO VISION, Bobigny (FR)

( * ) Notice: Subject to any disclaimer, the term of this patent is extended or adjusted under 35 U.S.C. 154(b) by 169 days.

(21) Appl. No.: 14/812,217

(22) Filed: Jul. 29, 2015

(65) Prior Publication Data

US 2016/0031361 A1 Feb. 4, 2016

(30) Foreign Application Priority Data

Jul. 31, 2014 (FR) ...................................... 14 57415

(51) Int. Cl.
*B60Q 1/00* (2006.01)
*B60Q 1/26* (2006.01)
*H05K 1/02* (2006.01)
*H05K 1/18* (2006.01)
*H05K 3/18* (2006.01)
*F21S 43/14* (2018.01)
(Continued)

(52) U.S. Cl.
CPC ......... *B60Q 1/0088* (2013.01); *B60Q 1/2696* (2013.01); *F21S 43/14* (2018.01); *F21S 43/19* (2018.01); *F21S 43/195* (2018.01); *H05K 1/0284* (2013.01); *H05K 1/184* (2013.01); *F21Y 2107/00* (2016.08); *F21Y 2115/10* (2016.08); *H05K 3/185* (2013.01); *H05K 2201/0129* (2013.01); *H05K 2201/09118* (2013.01); *H05K 2201/10106* (2013.01)

(58) Field of Classification Search
CPC ... B60Q 1/0088; B60Q 1/2696; F21S 48/211; F21S 48/212; F21S 48/215; H05K 1/0284; H05K 1/184
See application file for complete search history.

(56) References Cited

U.S. PATENT DOCUMENTS 5,331,512 A  * 7/1994 Orton .................... H01L 33/486
                                                 257/E33.059
7,044,620 B2    5/2006 Van Duyn
(Continued)

FOREIGN PATENT DOCUMENTS

DE    3545074 A1    6/1987
FR    2876965 A1  * 4/2006   ........... B60Q 1/2607
(Continued)

*Primary Examiner* — Mary Ellen Bowman
(74) *Attorney, Agent, or Firm* — Oblon, McClelland, Maier & Neustadt, L.L.P.

(57) ABSTRACT

A carrier of one or more light sources for a lighting and/or signaling module especially for an automotive vehicle, comprising: a substrate having at least one aperture and electrical tracks on at least one side; and at least one light-emitting diode (LED) having a body and electrical connection leads lateral to the body. The LED or at least one of the LEDs is placed through a respective aperture of the substrate, and the connection leads make contact with respective electrical tracks. The substrate is a rigid molded part having a three-dimensional shape possibly providing an optical function such as that of a reflector. In this case, the LEDs are directly supported by the optical part.

22 Claims, 3 Drawing Sheets

(51) Int. Cl.
*F21S 43/19* (2018.01)
*F21Y 107/00* (2016.01)
*F21Y 115/10* (2016.01)

(56) References Cited

U.S. PATENT DOCUMENTS

| | | | |
|---|---|---|---|
| 7,924,371 | B1 | 4/2011 | Davis |
| 8,770,791 | B2 | 7/2014 | Chao et al. |
| 2005/0243558 | A1* | 11/2005 | Van Duyn .............. H05K 1/182 362/294 |
| 2011/0140251 | A1* | 6/2011 | Camacho ................ H01L 24/14 257/676 |
| 2011/0228536 | A1* | 9/2011 | Im ....................... F21S 48/1109 362/249.06 |
| 2012/0112990 | A1 | 5/2012 | Chao et al. |
| 2013/0265199 | A1* | 10/2013 | Koskiniemi ............ G01S 19/14 342/450 |
| 2013/0329444 | A1* | 12/2013 | Oh .......................... F21V 21/00 362/543 |

FOREIGN PATENT DOCUMENTS

| | | | | |
|---|---|---|---|---|
| WO | 2010058904 | A2 | 5/2010 | |
| WO | WO 2010058904 | A2 * | 5/2010 | ......... F21S 48/1109 |
| WO | 2013141509 | A1 | 9/2013 | |

\* cited by examiner

CARRIER OF ONE OR MORE LIGHT-EMITTING DIODES (LEDS) FOR A SIGNALING MODULE

CROSS-REFERENCE TO RELATED APPLICATIONS

This application claims priority to the French application 1457415 filed on Jul. 31, 2014, which application is incorporated herein by reference and made a part hereof.

BACKGROUND OF THE INVENTION

1. Field of the Invention

The invention relates to the field of lighting and luminous signaling, especially for automotive vehicles. More precisely, the invention relates to the field of lighting and luminous signaling by means of light-emitting diodes (LEDs), and more particularly to the mounting of the LEDs in a signaling module.

2. Description of the Related Art

U.S. Pat. No. 5,331,512 discloses mounting an LED on a printed circuit board. The LED is reverse mounted (i.e. it is a "reverse mount" LED), namely the LED emits its light rays on that side of the board which is opposite the side on which the LED is mounted. For this purpose, the board comprises an orifice through which the optical part of the LED is inserted. The latter comprises a base with two extensions extending laterally in opposite directions, these extensions comprising contact zones intended to be soldered to corresponding contact zones of the board. The board and the base of the LED are made of a conventional circuit-board material, namely of glass-fiber reinforced epoxy resin. Such a material is designed to withstand the high temperatures induced locally by conventional soldering operations. The LED carrier disclosed in this teaching is advantageous for planar mounting. It is however less so for signaling modules of complex shape.

U.S. Pat. No. 7,924,371 discloses a screen for a night-vision imaging system. The screen comprises a printed circuit board on which a series of LEDs are arranged in a matrix, the series of LEDs being intended to backlight a liquid-crystal display. Certain of the LEDs are placed on the front side of the board, i.e. on the face directed toward the liquid-crystal display. Other LEDs are reverse mounted, i.e. they are placed on the back side of the board, through corresponding orifices, so as to provide forward illumination through the orifices. The LEDs are fixed in place and connected to the electrical tracks of the board by conventional solder joints. Similarly to the preceding teaching, the LED carrier disclosed in this teaching is advantageous for planar mounting. It is however less so for signaling modules of complex shape.

U.S. Patent Publication No. 2005/0243558, which issued as U.S. Pat. No. 7,044,620, discloses an LED carrier for a rear automotive vehicle light type signaling module. It consists of a printed circuit board comprising a series of orifices through which reverse mount LEDs are inserted. These LEDs comprise optical portions taking the form of domes, these domes being visible from the front side. The LEDs comprise fastening and electrical connection leads soldered to the electrical tracks on the back side of the board. This mounting schema provides a carrier that is attractive when it is observed by an observer located on the front-side side, the electrical connections being exclusively on the back side. In addition, it allows a radiator to be placed on the back side of the base of the LED. Similarly to the two preceding teachings, the LED carrier disclosed in this teaching is advantageous for planar mounting. It is however less so for signaling modules of complex shape.

SUMMARY OF THE INVENTION

The objective of the invention is to provide an LED carrier mitigating at least one of the drawbacks of the prior art. More precisely, the objective of the invention is to provide an LED carrier solution that is compatible with a module of non-planar shape and more particularly of complex shape. Another objective of the invention is to provide an LED carrier allowing the construction of a signaling module to be simplified and, therefore, its production cost to be decreased.

One subject of the invention is a carrier of one or more light sources for a luminous module especially for an automotive vehicle, comprising: a substrate having at least one aperture and electrical tracks on at least one side; and at least one light-emitting diode, light-emitting diode being abbreviated LED below, having a body and electrical connection leads lateral to the body, the or each of the LEDs being placed through a respective aperture of the substrate, the connection leads making contact with respective electrical tracks; noteworthy in that the substrate is a rigid molded part having a three-dimensional shape.

The expression "luminous module" is understood to mean a lighting module for lighting the road in front of the vehicle, or a signaling module for signaling the position of the vehicle to other road users, or even an interior lighting module for lighting the interior of a passenger compartment of the vehicle.

The aperture or each of the apertures is a through-aperture passing right through the thickness of the substrate.

In one example embodiment, the body of the LED comprises a top wall comprising at least one light emission area and a side wall extending around the top wall. The lateral electrical connection leads advantageously extend from the side wall substantially parallel to the top wall. Advantageously, the LED has two electrical connection leads, placed on either side of the body.

The one or more LEDs are configured to light that side of the substrate which corresponds to the side opposite that comprising the electrical tracks.

According to one advantageous embodiment of the invention, the substrate forms a wall having over its extent variations in height of more than 10% and preferably 20% of its extent. The variations in height are in a direction generally perpendicular to a reference plane. The latter may correspond to a portion of the wall, or even to its midplane. The thickness of the wall may be generally constant. It may be comprised between 0.5 and 3 mm.

According to one advantageous embodiment of the invention, the substrate has one or more cavity- and/or step-shaped portions.

According to one advantageous embodiment of the invention, the leads of the one or more LEDs are connected to respective electrical tracks by an adhesive filled with metal particles, said adhesive preferably being a polymer adhesive that it is possible to polymerize after application. The use of the adhesive is advantageous in that it makes it possible to avoid subjecting the substrate to thermal stresses.

According to one advantageous embodiment of the invention, the leads of the one or more LEDs are connected to respective electrical tracks by a metal, for example copper, this metal being deposited by a chemical metalization process. The metalization process for connecting the leads to the tracks may especially be carried out at the same time as the process allowing these tracks of the substrate to be metalized.

According to one advantageous embodiment of the invention, the carrier comprises a connector integrally formed with the substrate.

According to one advantageous embodiment of the invention, the material of the substrate is a thermoplastic doped with metal particles so as to allow electrical tracks to adhere.

According to one advantageous embodiment of the invention, the substrate comprises at least one electronic component connected electrically to the diode or to at least one of the LEDs by the electrical tracks. The one or more components may be electrically and mechanically connected by an adhesive filled with metal particles such as described above.

According to one advantageous embodiment of the invention, the substrate has at least one surface interacting with the light rays emitted by the one or more LEDs so as to provide an optical function. The substrate may play both the role of a carrier of the one or more LEDs and the role of a reflector.

According to one advantageous embodiment of the invention, the surface or at least one of the surfaces of the substrate, interacting with the light rays, is reflective, absorbent or scattering.

According to one advantageous embodiment of the invention, the substrate comprises a reflective, absorbent or scattering coating on its side opposite that of the electrical tracks. This reflective coating may advantageously be deposited via the same metalization process allowing these tracks to be produced.

Another subject of the invention is a signaling module comprising: a carrier of one or more light sources; and an optical part, such as a reflector, interacting with the light rays emitted by the one or more light sources; noteworthy in that the carrier is according to the invention.

According to one advantageous embodiment of the invention, the carrier comprises the optical part and preferably the carrier forms the optical part.

Another subject of the invention is a lighting and/or signaling device, comprising: a housing; a luminous module disposed in the housing; and an outer lens placed on the housing; noteworthy in that the module is according to the invention.

The measures of the invention are advantageous in that they simplify the production of the LED carrier, in particular for signaling devices or modules of complex shape. Specifically, in the case of a module comprising many LEDs distributed over a reflector of complex shape, such as for example a generally curved shape matching the curvature at one of the rear corners of a vehicle, and having a series of reflective surface portions directed toward the rear of the vehicle. Such a reflector may thus have a tiered shape compatible with production by molding. In the absence of the invention, it would be necessary to produce a series of small planar carriers or even to provide a flexible elongate substrate (a "flex PCB" or "flex circuit"), and to fasten it or them with precision to the back side of the reflector. By virtue of the invention, the carrier may closely follow the back side of the reflector or even also provide the reflector function.

These and other objects and advantages of the invention will be apparent from the following description, the accompanying drawings and the appended claims.

BRIEF DESCRIPTION OF THE ACCOMPANYING DRAWINGS

Other features and advantages of the present invention will be better understood from the description and drawings, in which.

DETAILED DESCRIPTION OF THE PREFERRED EMBODIMENTS

Figure 1:
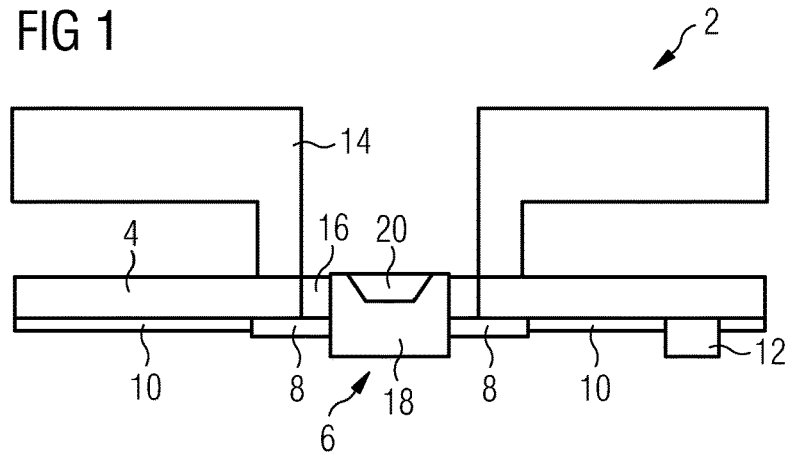
FIG. 1 is a schematic illustration of a carrier according to a first embodiment of the invention.

FIG. 1 is a schematic illustration of a first embodiment of the invention. This illustration corresponds to a cross-sectional or profile view of a carrier 2 comprising a substrate 4 having at least one orifice 16 through which a reverse mount light-emitting diode (LED) 6 is placed. The LED 6 comprises a body 18 having an optical portion 20 and fastening and electrical connection leads 8. The substrate 4 comprises electrical tracks 10 on its back side, this side corresponding to the bottom side in the figure. The LED 6 is placed on the back side, so that its body 18 and more particularly its optical portion 20 penetrates at least partially the orifice 16. The leads 8 make mechanical and electrical contact with corresponding electrical tracks 10 via a polymer adhesive doped with metal particles or via copper deposited by a chemical process.

The back side of the substrate 4 may comprise one or more electrical or electronic components 12.

An optical element or reflector 14 is placed on the front side of the substrate 4 in such a way as to interact with the light rays emitted by the LED 6. This optical element or reflector 14 may be reflective, absorbent or even scattering, or even a combination of the latter.

In contrast to what FIG. 1 may have led the reader to believe, the substrate 4 is not planar, i.e. it has a three-dimensional shape. It essentially consists of a wall extending with variations in height so as to form a three-dimensional shape. The substrate 4 is produced by molding one or more plastic materials. The one or more materials is/are preferably thermoplastic. The molding may thus be carried out by injecting the material into a mold. The latter, installed on a press, most often consists of two halves corresponding to a stationary portion and a movable portion that are firmly pressed one against the other at the moment of the molding then separated in order to allow the molded part to be ejected. The mold may also comprise one or more cores intended to form hollow portions of the part and punches allowing apertures to be produced in its walls. It is also possible to place in the mold inserts made of another material or at least of another color, which are subsequently included in the part.

The plastic material of the substrate 4 may be doped with metal particles able to ensure the adhesion of metal tracks to its exterior surface. This technology is commonly designated by the acronym MID (for Molded Interconnect Device).

The electrical tracks 10 may be produced using the technology designated by the acronym LDS (for Laser Direct Structuring). It is a question of tracing a laser beam over the corresponding surface of the substrate 4, according to the configuration of the electrical tracks 10 to be produced. The laser beam has the effect of forming a roughness able to promote adhesion. This step is followed by a metalization operation in which the substrate 4 is dipped into one or more successive metal baths.

Alternatively or additionally, the electrical tracks 10 may be produced by inkjet printing of an ink containing metal particles.

The electrical tracks 10 may also be produced by two-shot molding. It is a question of an injection molding process using two different resins only one of which is metalizable. Typically, the metalizable resin is ABS and the non-metalizable resin is polycarbonate. The substrate 4 is then subjected to an electroless deposition process in which butadiene is used to make the surface rough chemically and allow a copper primer layer to adhere.

Because of the thermoplastic nature of the substrate 4, it is not appropriate to use conventional soldering processes for the electrical contacts 10. The fastening and connection leads 8 of the LED 6 are thus electrically and mechanically fastened by applying a polymer-based adhesive filled with metal elements. It is thus a question of what is referred to as a "cold" application process that does not damage the substrate 4. After polymerization of the adhesive, the latter ensures the LED 6 is electrically and mechanically fastened.

Figure 2:
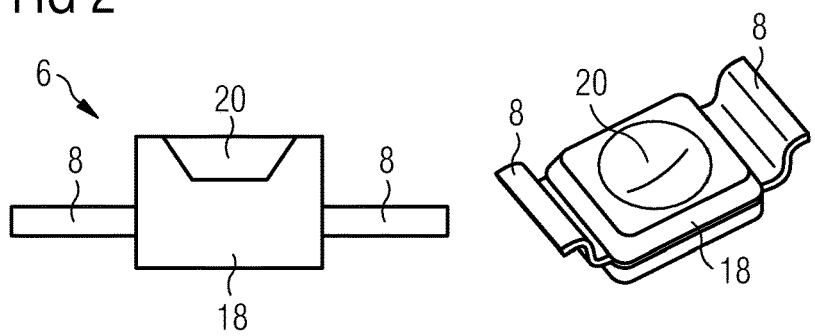
FIG. 2 is an illustration of the LED present in FIG. 1.

FIG. 2 illustrates the LED 6 in FIG. 1. The left-hand side view is a schematic plan view corresponding to that in FIG. 1, whereas the right-hand side view is a perspective representation of a corresponding commercially available LED 6. In the two views, the reverse nature of the LED 6, its body 18, its optical portion 20 and its fastening leads 8 may be clearly seen. More particularly, in the right-hand view the circular shape of the optical portion 20 and the stepped cross section of the leads 8 may be seen.

Figure 3:
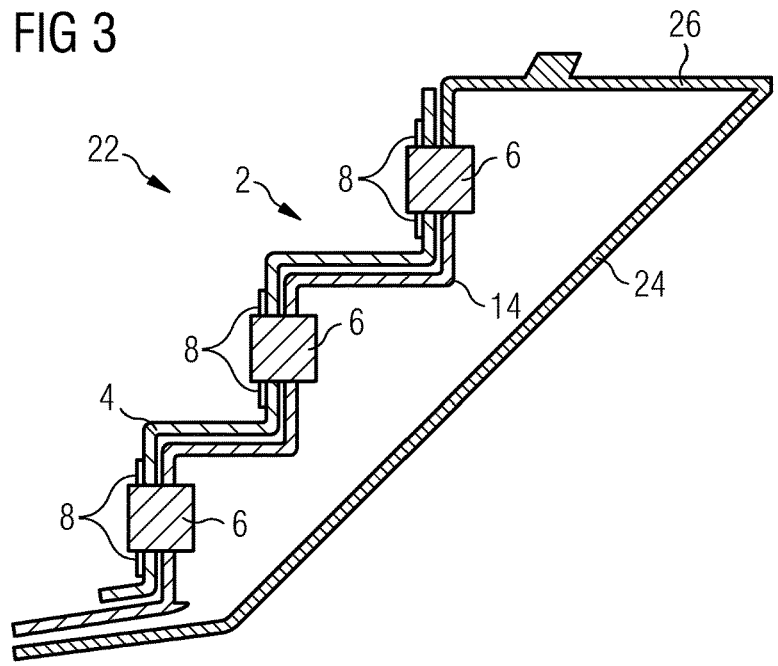
FIG. 3 is a cross-sectional view of a signaling device according to the first embodiment.

FIG. 3 is a cross-sectional view of a signaling device 22 according to the first embodiment, implementing the principle illustrated in FIG. 1. The device 22 comprises a housing 26 with an outer lens 24 and a reflector 14. The latter has a stepped shape with a series of orifices through which LEDs 6 are placed. The latter are fastened to a substrate 4 that closely follows at least partially the stepped shape of the reflector 14. The molded substrate 4 may closely follow the shape of the reflector 14 or at least have a complex shape able to match or conform to a reflector 14 or at least an optical element of nonplanar shape.

The carrier 2 formed by the substrate 4 and the LEDs 6, which are assembled therewith, may thus be placed directly on the other elements of the signaling device 22.

Figure 4:
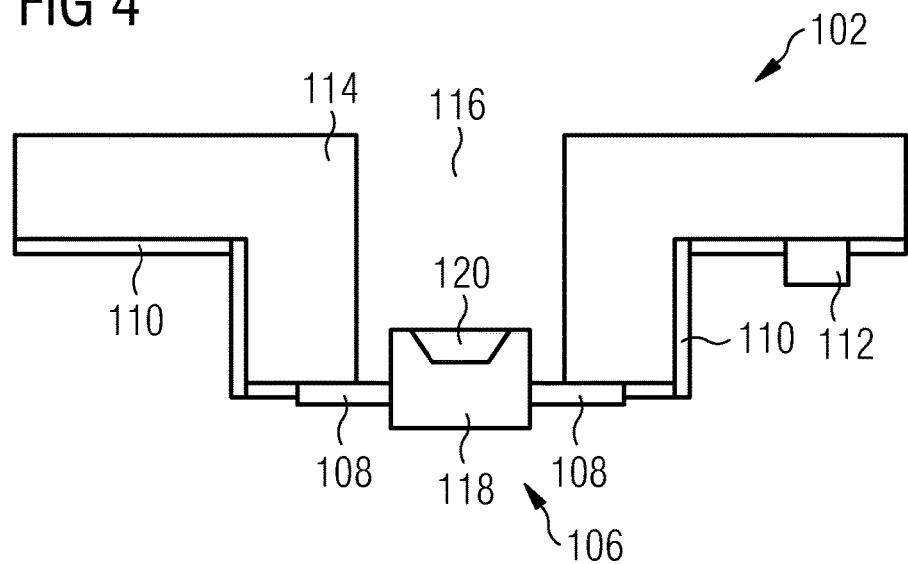
FIG. 4 is a schematic illustration of a carrier according to a second embodiment of the invention.
Figure 5:
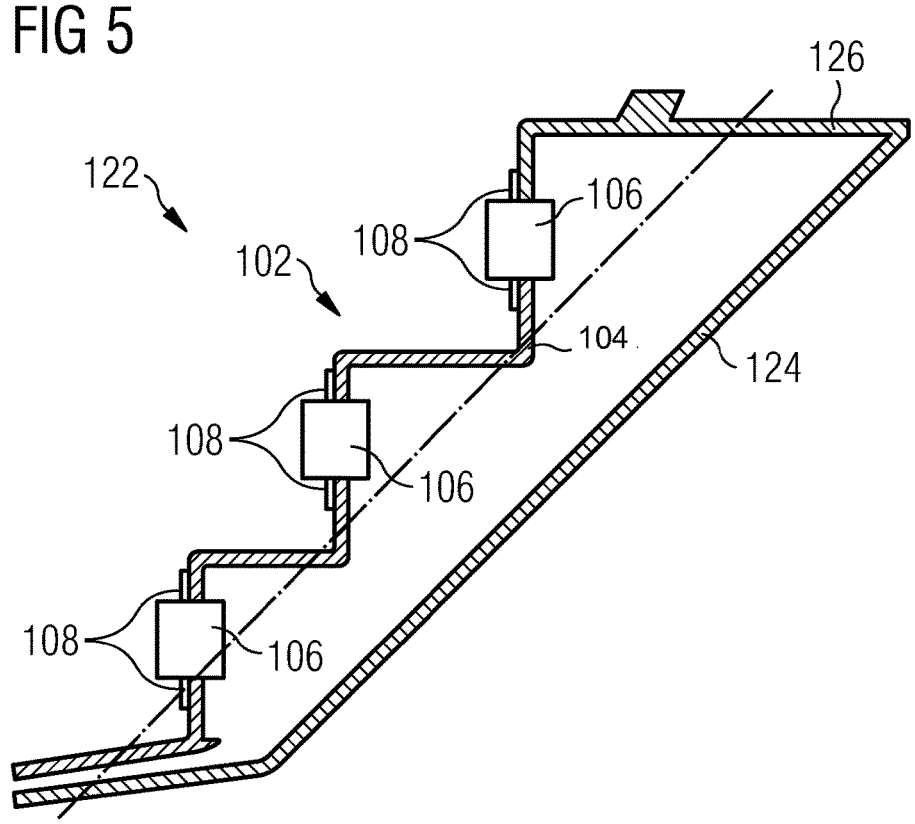
FIG. 5 is a cross-sectional view of a signaling device according to the second embodiment.

FIGS. 4 and 5 schematically illustrates a carrier 102 of one or more light sources according to a second embodiment. The reference numbers of the first embodiment are used for identical or corresponding elements of the second embodiment, these numbers being however increased by 100 in order to make it easy to tell the two embodiments apart.

The carrier 102 comprises a substrate 104 of nonplanar shape and providing an optical function. This substrate 104 comprises electrical tracks 110 on its back side. It may also comprise one or more electrical or electronic components 112 on its back side, electrically connected to the electrical tracks 110. The substrate 104 comprises an orifice 116 through which is inserted, at least partially, an LED 106. The latter is of similar construction to that of the first embodiment. It is a question of a reverse mount LED model, i.e. of an LED intended to be placed on that side of the substrate 104 which is opposite the side on which the light rays will be emitted. The body 118 of the LED 106 is thus inserted through the orifice 116 from the back side of the substrate 104, so that its optical portion 120 faces forward, i.e. on the same side as the front side of the substrate 104. During the insertion of the LED 106, its leads 108 make contact with the back side of the substrate 104 and more precisely with corresponding electrical tracks 110. The contact is ensured by metal-doped adhesive. This adhesive is preferably a synthetic polymer adhesive that can be polymerized after application in the pasty state. The reader is referred to the description of the adhesive fastening operation of the first embodiment.

As may be seen in FIGS. 4 and 5, the substrate 104 is not planar, i.e. it has a three-dimensional shape. Similarly to the substrate 4 of the first embodiment, it essentially consists of a wall extending with variations in height so as to form a three-dimensional shape. The substrate 104 is produced by molding one or more plastic materials. The reader is referred to the description of the first embodiment as regards the substrate molding process.

In order to provide an optical function the substrate 104 may be covered, especially on its front side or at least on portions of its front side, with a reflective, absorbent or scattering coating. This coating may be applied by various processes well known per se to those skilled in the art, such as metalization for a reflective coating, or application of a coat of absorbent or scattering paint.

FIG. 5 is a cross-sectional view of a signaling device 122 according to the second embodiment, implementing the principle illustrated in FIG. 4. The signaling device 122 comprises a housing 126 with an outer lens 124 and a reflector 114. The latter has a stepped shape and forms a substrate 104 with a series of orifices through which and on which LEDs 106 are placed directly. The front side of the substrate 104 is reflective. The LEDs 106 are fastened to the back side of the substrate 104 by means of their leads 108. The molded substrate 104 may thus take the form of an optical element of complex shape. The mounting of the signaling device 122 is thus made particularly simple. Specifically, in the example in FIG. 5, the signaling device 122 essentially consists of only three elements to be assembled, namely the carrier 102 equipped with the LEDs 106, the housing 126 and the outer lens 124. The housing 126 and the outer lens 124 may form a single part.

Figure 6:
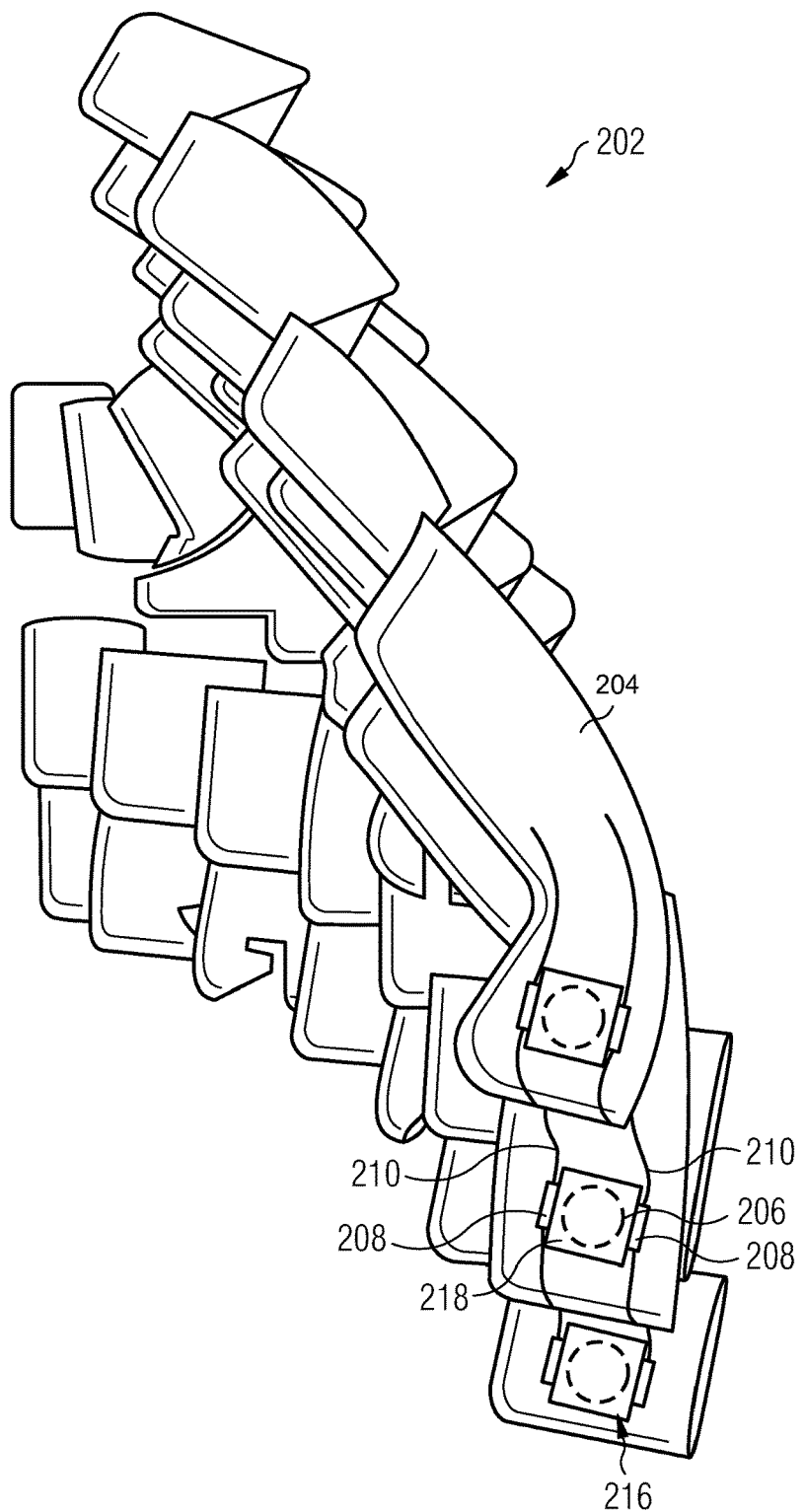
FIG. 6 is a perspective view of a carrier according to a third embodiment of the invention.

FIG. 6 illustrates an LED carrier 202 according to a third embodiment of the invention. The reference numbers of the second embodiment are used for identical or corresponding elements of this third embodiment, these numbers being however increased by 100 in order to make it easy to tell the two embodiments apart.

This third embodiment is similar to the second embodiment shown in FIGS. 4 and 5. The carrier 202 comprises a substrate 204 of complex shape with a series of stepped profiles. The front side (corresponding to the side on the left in the figure) is reflective. The LEDs 206 are placed on and fastened to the back side (corresponding to the side on the right in the figure). Only three LEDs 206 have been shown in the figure, it being understood that more LEDs 206 may be present. The conductive tracks 210 are formed on the back side of the substrate 204, so as to extend continuously from surface portion to surface portion and to connect the leads 208 to one another. FIG. 6 thus shows an optical part of complex shape able to be formed by molding of a plastic material and able to serve as a carrier 202 of LEDs 206 and electrical tracks 210.

Generally, the substrate 4 may provide other functions such as especially that of a connector. Specifically, a connector may be molded directly with the material of the substrate 4. It may also comprise an insert around which the material of the substrate 4 is injection molded. Other elements may also be provided on the substrate 4 providing other functions, such as especially fastening elements.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A carrier of one or more light sources for a luminous module for an automotive vehicle, comprising:
    a substrate that is rigid and has at least one aperture and electrical tracks on at least one side; and
    at least one or more light-emitting diodes (LEDs), each of said at least one or more LEDs having a body and electrical connection leads lateral to said body, said at least one or more LEDs being placed through said at least one aperture of said substrate, said electrical connection leads making contact with respective said electrical tracks;
    wherein said substrate is a rigid molded part having a three-dimensional shape,
    wherein a material of said substrate is a thermoplastic doped with conductive metal particles and is configured to adhere to said electrical tracks, and
    wherein an optical portion of said at least one or more LEDs extends beyond an opposite surface of said substrate from said at least one side of said substrate with said electrical tracks.

2. The carrier according to claim 1, wherein said substrate forms a wall having over its extent variations in height of more than 10% of its extent.

3. The carrier according to claim 1, wherein said substrate has one or more cavity- and/or step-shaped portions.

4. The carrier according to claim 1, wherein said electrical connection leads of said at least one or more LEDs are connected to respective electrical tracks by a polymer adhesive filled with metal particles, said polymer adhesive configured to polymerize after application.

5. The carrier according to claim 1, wherein said electrical connection leads of said at least one or more LEDs are connected to respective electrical tracks by a metal, said metal being deposited by a chemical metalization process.

6. The carrier according to claim 1, wherein said carrier comprises a connector integrally formed with said substrate.

7. The carrier according to claim 1, wherein said substrate comprises at least one electronic component connected electrically to said at least one or more LEDs by said electrical tracks.

8. The carrier according to claim 1, wherein said substrate has at least one surface interacting with light rays emitted by said at least one or more LEDs to provide an optical function.

9. The carrier according to claim 8, wherein said at least one surface of said substrate, interacting with the light rays, is reflective, absorbent or scattering.

10. The carrier according to claim 8, wherein said substrate comprises a reflective, absorbent or scattering coating on its side opposite that of said electrical tracks.

11. A signaling module comprising:
    a carrier of one or more light sources; and
    an optical part, interacting with light rays emitted by said one or more light sources;
    wherein said carrier is according to claim 1.

12. The signaling module according to claim 11, wherein said carrier comprises said optical part and said carrier forms said optical part.

13. A lighting and/or signaling device comprising:
    a housing;
    a luminous module disposed in said housing; and
    an outer lens placed on said housing;
    wherein said luminous module is a signaling module according to claim 11.

14. The carrier according to claim 2, wherein said substrate has one or more cavity- and/or step-shaped portions.

15. The carrier according to claim 2, wherein said electrical connection leads of said at least one or more LEDs are connected to respective electrical tracks by an adhesive filled with metal particles, said adhesive being a polymer adhesive configured to polymerize after application.

16. The carrier according to claim 3, wherein said electrical connection leads of said at least one or more LEDs are connected to respective electrical tracks by an adhesive filled with metal particles, said adhesive being a polymer adhesive configured to polymerize after application.

17. A lighting and/or signaling device, comprising:
    a housing;
    a luminous module disposed in said housing; and
    an outer lens placed on said housing;
    wherein said luminous module is a signaling module according to claim 12.

18. The signaling module of claim 11, wherein said optical part comprising a reflector.

19. A signaling module comprising:
    a carrier of one or more light sources; and
    an optical part, interacting with light rays emitted by said one or more light sources;
    wherein said carrier is according to claim 3.

20. The carrier according to claim 5, wherein said metal is copper.

21. The carrier according to claim 1, wherein said electrical connection leads of said at least one or more LEDs are step-shaped to mechanically connect to said electrical tracks.

22. The carrier according to claim 21, wherein said electrical connection leads of said at least one or more LEDs are also connected to said electrical tracks with a metal-doped adhesive.

* * * * *